US011258003B2

(12) United States Patent
Kakiuchi et al.

(10) Patent No.: US 11,258,003 B2
(45) Date of Patent: Feb. 22, 2022

(54) PIEZOELECTRIC ACTUATOR, LIQUID DISCHARGE HEAD, AND MANUFACTURING METHOD OF PIEZOELECTRIC ACTUATOR

(71) Applicant: Brother Kogyo Kabushiki Kaisha, Nagoya (JP)

(72) Inventors: Toru Kakiuchi, Chita-gun (JP); Keita Hirai, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 896 days.

(21) Appl. No.: 15/933,471

(22) Filed: Mar. 23, 2018

(65) Prior Publication Data

US 2019/0097122 A1    Mar. 28, 2019

(30) Foreign Application Priority Data

Sep. 27, 2017   (JP) .............................. JP2017-186864

(51) Int. Cl.
*H01L 41/09* (2006.01)
*H01L 41/047* (2006.01)
(Continued)

(52) U.S. Cl.
CPC .......... *H01L 41/09* (2013.01); *B41J 2/14201* (2013.01); *B41J 2/14233* (2013.01); *B41J 2/161* (2013.01);
(Continued)

(58) Field of Classification Search
CPC ..... H01L 41/09; H01L 41/047; B41J 2/14201
(Continued)

(56) References Cited

U.S. PATENT DOCUMENTS 9,656,467 B2    5/2017   Kakiuchi et al.
2011/0205308 A1  8/2011   Miyata
(Continued)

FOREIGN PATENT DOCUMENTS

JP    2006-278579 A    10/2006
JP    2007-076129 A     3/2007
(Continued)

OTHER PUBLICATIONS

Aug. 24, 2021—(JP) Notice of Reasons for Refusal—App 2017-186864, Eng Tran.

*Primary Examiner* — Derek J Rosenau
(74) *Attorney, Agent, or Firm* — Banner & Witcoff, Ltd.

(57) ABSTRACT

A piezoelectric actuator includes: a plurality of discrete electrodes, which is disposed on one side of a piezoelectric element; a common electrode, which is disposed on the other side of the piezoelectric element; a plurality of discrete contacts, which are respectively connected to the plurality of discrete electrodes, and wherein the plurality of discrete electrodes include: a first discrete electrode; and a second discrete electrode, which is disposed at a position away from a corresponding discrete contact as compared with the first discrete electrode, wherein the common electrode includes: a first common electrode, which faces the first discrete electrode in the thickness direction; and a second common electrode, which is separated from the first common electrode in the surface direction and faces the second discrete electrode in the thickness direction, and wherein a connection wiring is provided to connect the first common electrode with the second common electrode.

21 Claims, 9 Drawing Sheets

(51) Int. Cl.
  *B41J 2/14* (2006.01)
  *H01L 41/22* (2013.01)
  *H01L 41/31* (2013.01)
  *B41J 2/16* (2006.01)
  *H01L 27/20* (2006.01)
  *H01L 41/29* (2013.01)

(52) U.S. Cl.
  CPC ........... *B41J 2/1623* (2013.01); *B41J 2/1629* (2013.01); *B41J 2/1632* (2013.01); *B41J 2/1643* (2013.01); *B41J 2/1646* (2013.01); *H01L 27/20* (2013.01); *H01L 41/047* (2013.01); *H01L 41/0475* (2013.01); *H01L 41/0973* (2013.01); *H01L 41/22* (2013.01); *H01L 41/29* (2013.01); *H01L 41/31* (2013.01); *B41J 2002/14491* (2013.01)

(58) Field of Classification Search
  USPC .......................................................... 310/328
  See application file for complete search history.

(56) References Cited

U.S. PATENT DOCUMENTS

| | | | |
|---|---|---|---|
| 2013/0208056 A1* | 8/2013 | Hirai | B41J 2/14233 347/71 |
| 2013/0222484 A1* | 8/2013 | Yokoyama | B41J 2/1628 347/70 |
| 2015/0102835 A1 | 4/2015 | Huygens et al. | |
| 2015/0273829 A1* | 10/2015 | Yamashita | H01L 41/0973 347/70 |
| 2016/0185116 A1 | 6/2016 | Kakiuchi et al. | |
| 2016/0185118 A1 | 6/2016 | Tanaka | |
| 2017/0087842 A1 | 3/2017 | Koide et al. | |

FOREIGN PATENT DOCUMENTS

| | | |
|---|---|---|
| JP | 4707510 B2 | 6/2011 |
| JP | 2011-167955 A | 9/2011 |
| JP | 2016-124120 A | 7/2016 |
| JP | 2016-124153 A | 7/2016 |
| JP | 2017-064922 A | 4/2017 |

\* cited by examiner

PIEZOELECTRIC ACTUATOR, LIQUID DISCHARGE HEAD, AND MANUFACTURING METHOD OF PIEZOELECTRIC ACTUATOR

CROSS-REFERENCE TO RELATED APPLICATION

This application claims priority from Japanese Patent Application No. 2017-186864 filed on Sep. 27, 2017 the entire subject matter of which is incorporated herein by reference.

TECHNICAL FIELD

This disclosure relates to a piezoelectric actuator, a liquid discharge head having the piezoelectric actuator, and a manufacturing method of the piezoelectric actuator.

BACKGROUND

There is a known problem in a piezoelectric actuator in that an applying voltage deviates due to a difference in distance from a discrete contact between a plurality of discrete electrodes. In order to solve the above problem, the background art discloses that a conductive wiring electrically connected to a common electrode is provided at a position adjacent to the discrete electrode which is positioned away from the discrete contact.

SUMMARY

In the background art, the common electrode is formed over the almost entire surface of a substrate, and faces all the discrete electrodes. In this case, a residual stress is increased because of the forming of the common electrode. Therefore, warpage occurs in the entire piezoelectric actuator, and the piezoelectric actuator may be peeled out of the substrate.

This disclosure is to provide a piezoelectric actuator, a liquid discharge head having the piezoelectric actuator, and a manufacturing method of the piezoelectric actuator, which are capable of suppressing warpage of the piezoelectric actuator and suppressing the deviation in an applying voltage due to a difference in distance from a discrete contact in a plurality of discrete electrodes.

A piezoelectric actuator of this disclosure includes: a piezoelectric element; a plurality of discrete electrodes, which is disposed on one side of the piezoelectric element in a thickness direction of the piezoelectric element; a common electrode, which is disposed on the other side of the piezoelectric element in the thickness direction of the piezoelectric element, and faces the plurality of discrete electrodes in the thickness direction with the piezoelectric element interposed therebetween; a plurality of discrete contacts, which are respectively connected to the plurality of discrete electrodes, and a common contact, which is connected to the common electrode. The plurality of discrete electrodes includes; a first discrete electrode; and a second discrete electrode, which is disposed at a position away from a corresponding discrete contact among the plurality of discrete contacts in a surface direction of the piezoelectric element, as compared with the first discrete electrode, wherein the common electrode includes: a first common electrode, which faces the first discrete electrode in the thickness direction; and a second common electrode, which is separated from the first common electrode in the surface direction and faces the second discrete electrode in the thickness direction, wherein it is formed to satisfy at least one of a condition where the first common electrode faces a plurality of the first discrete electrodes in the thickness direction and a condition where the second common electrode faces a plurality of the second discrete electrodes in the thickness direction, and wherein a connection wiring is further provided to connect the first common electrode with the second common electrode.

A piezoelectric actuator according to another aspect includes: a piezoelectric element; a plurality of discrete electrodes, which is disposed on one side of the piezoelectric element in a thickness direction of the piezoelectric element; a common electrode, which is disposed on the other side of the piezoelectric element in the thickness direction and faces the plurality of discrete electrodes in the thickness direction with the piezoelectric element interposed therebetween; a plurality of discrete contacts, which are respectively connected to the plurality of discrete electrodes, and a common contact, which is connected to the common electrode, wherein the plurality of discrete electrodes include: a plurality of first discrete electrodes, which are arranged in a first direction along a surface direction of the piezoelectric element and form a first discrete electrode row; and a plurality of second discrete electrodes, which are arranged in the first direction, form a second discrete electrode row that is arranged beside the first discrete electrode row in a second direction perpendicular to the first direction and along the surface direction and which are disposed at positions away from each corresponding discrete contact among the plurality of discrete contacts in the second direction, as compared with the plurality of first discrete electrodes, wherein the common electrode includes: a first common electrode, which faces at least one of the plurality of first discrete electrodes in the thickness direction; and a second common electrode, which is separated from the first common electrode in the second direction and faces at least one of the plurality of second discrete electrodes in the thickness direction, wherein at least one of the first common electrode and the second common electrode is made to extend in the first direction, and wherein a connection wiring is further provided to connect the first common electrode with the second common electrode.

A liquid discharge head of this disclosure includes the above-described piezoelectric actuator; a substrate, in which the piezoelectric actuator is disposed and a plurality of pressure chambers are formed to face the plurality of discrete electrodes in the thickness direction; and a nozzle plate, which is disposed on a side opposite to the piezoelectric actuator with respect to the substrate, and in which a plurality of nozzles are formed to communicate with the plurality of pressure chambers.

A manufacturing method of a piezoelectric actuator of this disclosure includes: forming a piezoelectric element; forming a plurality of discrete electrodes on one side of the piezoelectric element in a thickness direction of the piezoelectric element; forming a common electrode on the other side of the piezoelectric element in the thickness direction to face the plurality of discrete electrodes in the thickness direction with the piezoelectric element interposed therebetween; forming a plurality of discrete contacts to respectively connect the plurality of discrete electrodes; forming a common contact to connect the common electrode; and forming a plurality of discrete wirings to connect the plurality of discrete electrodes with the plurality of discrete contacts, wherein, in the forming of the plurality of discrete electrodes, the plurality of discrete electrodes is formed to include: a first discrete electrode; and a second discrete electrode, which is disposed at a position away from a corresponding discrete contact among the plurality of discrete contacts in a surface direction of the piezoelectric element, as compared with the first discrete electrode, wherein, in the forming of the common electrode, the common electrode is formed to include: a first common electrode, which faces the first discrete electrode in the thickness direction; and a second common electrode which is separated from the first common electrode in the surface direction and faces the second discrete electrode in the thickness direction is formed, wherein it is formed to satisfy at least one of a condition where the first common electrode faces a plurality of the first discrete electrodes in the thickness direction and a condition where the second common electrode faces a plurality of the second discrete electrodes in the thickness direction, and wherein, in the forming of the plurality of discrete wirings, a connection wiring which connects the first common electrode with the second common electrode is formed in the same process as the forming of the plurality of discrete wirings.

A manufacturing method of a piezoelectric actuator according to another aspect includes: forming a piezoelectric element; forming a plurality of discrete electrodes on one side of the piezoelectric element in a thickness direction of the piezoelectric element; forming a common electrode on the other side the piezoelectric element in the thickness direction to face the plurality of discrete electrodes in the thickness direction with the piezoelectric element interposed therebetween; forming a plurality of discrete contacts to respectively connect the plurality of discrete electrodes; forming a common contact to connect the common electrode; and forming a plurality of discrete wirings to connect the plurality of discrete electrodes with the plurality of discrete contacts, wherein, in the forming of the plurality of discrete electrodes, the plurality of discrete electrodes is formed to include: a plurality of first discrete electrodes, which are arranged in a first direction along a surface direction of the piezoelectric element and form a first discrete electrode row; and a plurality of second discrete electrodes, which are arranged in the first direction, form a second discrete electrode row that is arranged beside the first discrete electrode row in a second direction perpendicular to the first direction and along the surface direction and which are disposed at positions away from corresponding discrete contacts among the plurality of discrete contacts in the second direction, as compared with the plurality of first discrete electrodes, wherein, in the forming of the common electrode, the common electrode is formed to include: a first common electrode which faces at least one of the plurality of first discrete electrodes in the thickness direction; and a second common electrode which is separated from the first common electrode in the second direction and faces at least one of the plurality of second discrete electrodes in the thickness direction, wherein at least one of the first common electrode and the second common electrode is made to extend in the first direction, and wherein in the forming of the plurality of discrete wirings, a connection wiring which connects the first common electrode with the second common electrode is formed in the same process as the forming of the plurality of discrete wirings.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Figure 1:
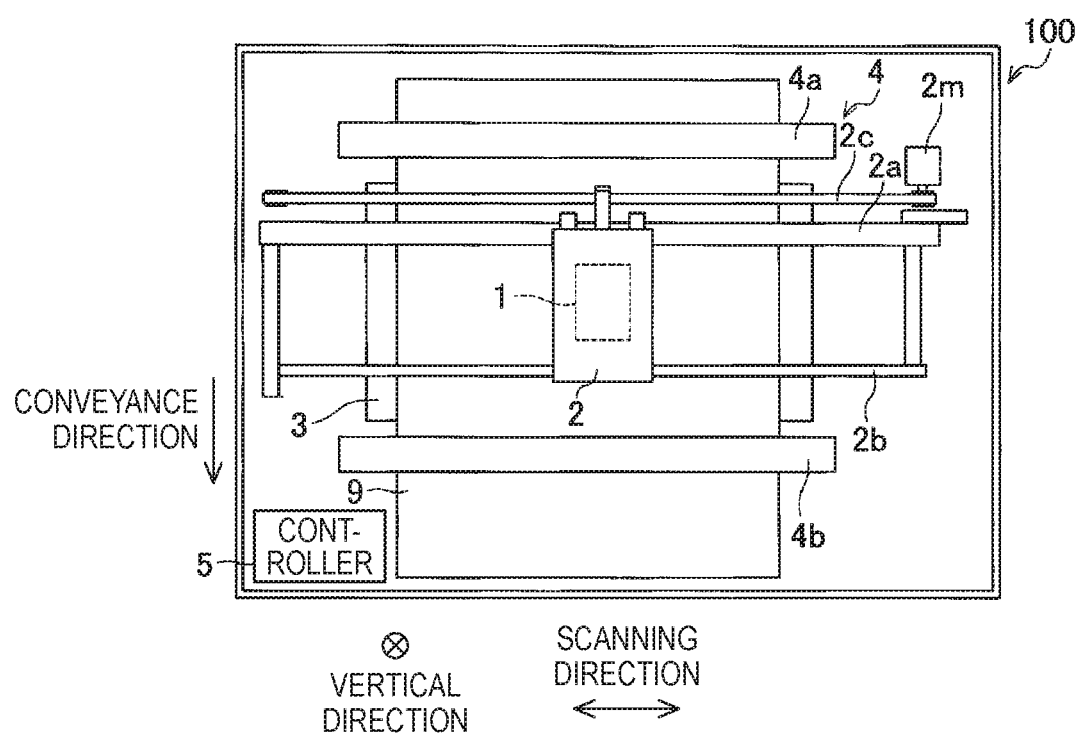
FIG. 1 is a plan view of a printer according to an embodiment of this disclosure.

A printer 100 according to an embodiment of this disclosure includes a head 1, a carriage 2, a platen 3, a conveying mechanism 4, and a controller 5 as illustrated in FIG. 1.

A paper sheet 9 is placed on the upper surface of the platen 3.

The carriage 2 is supported by two guide rails 2a and 2b on the upper side of the platen 3, and connected to an endless belt 2c. When a carriage drive motor 2m is driven by the control of the controller 5, the endless belt 2c runs, and the carriage 2 moves in a scanning direction along the guide rails 2a and 2b.

The head 1 is attached to the carriage 2 in a serial type, and moves in the scanning direction together with the carriage 2. On the lower surface of the head 1, a plurality of nozzles 11n (see FIGS. 2 and 4) are formed.

The conveying mechanism 4 includes two roller pairs 4a and 4b which are disposed to interpose the platen 3 in a conveyance direction. When a conveyance motor (not illustrated) is driven by the control of the controller 5, the roller pairs 4a and 4b rotate with the paper sheet 9 interposed therebetween, and the paper sheet 9 is conveyed in the conveyance direction.

The controller 5 includes a read only memory (ROM), a random access memory (RAM), and an application specific integrated circuit (ASIC). The ASIC performs a record process according to a program stored in the ROM. In the record process, the controller 5 controls a driver IC 19 of the head 1 (see FIG. 4), the carriage drive motor 2m, and the conveyance motor (not illustrated) on the basis of a record command (including image data) input from an external device such as a PC, and records the image on the paper sheet 9. Specifically, a discharge operation in which ink drops are discharged from the nozzle 11n while moving the head 1 in the scanning direction together with the carriage and a conveyance operation in which the paper sheet 9 is conveyed by a predetermined amount in the conveyance direction by the roller pairs 4a and 4b are performed alternately.

Next, a configuration of the head 1 will be described with reference to FIGS. 2 to 5.

Figure 2:
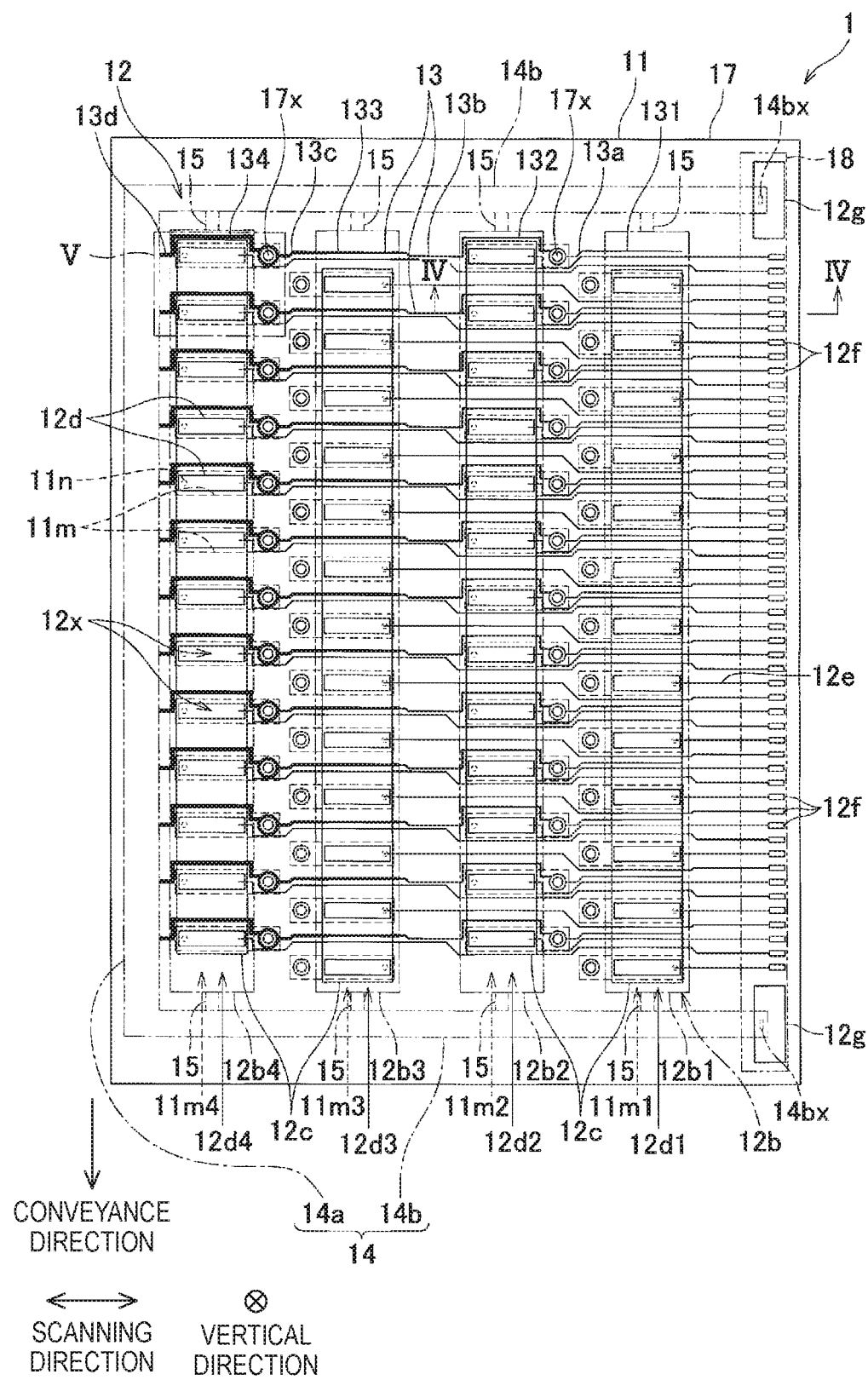
FIG. 2 is a plan view of a head which is contained in the printer.
Figure 4:
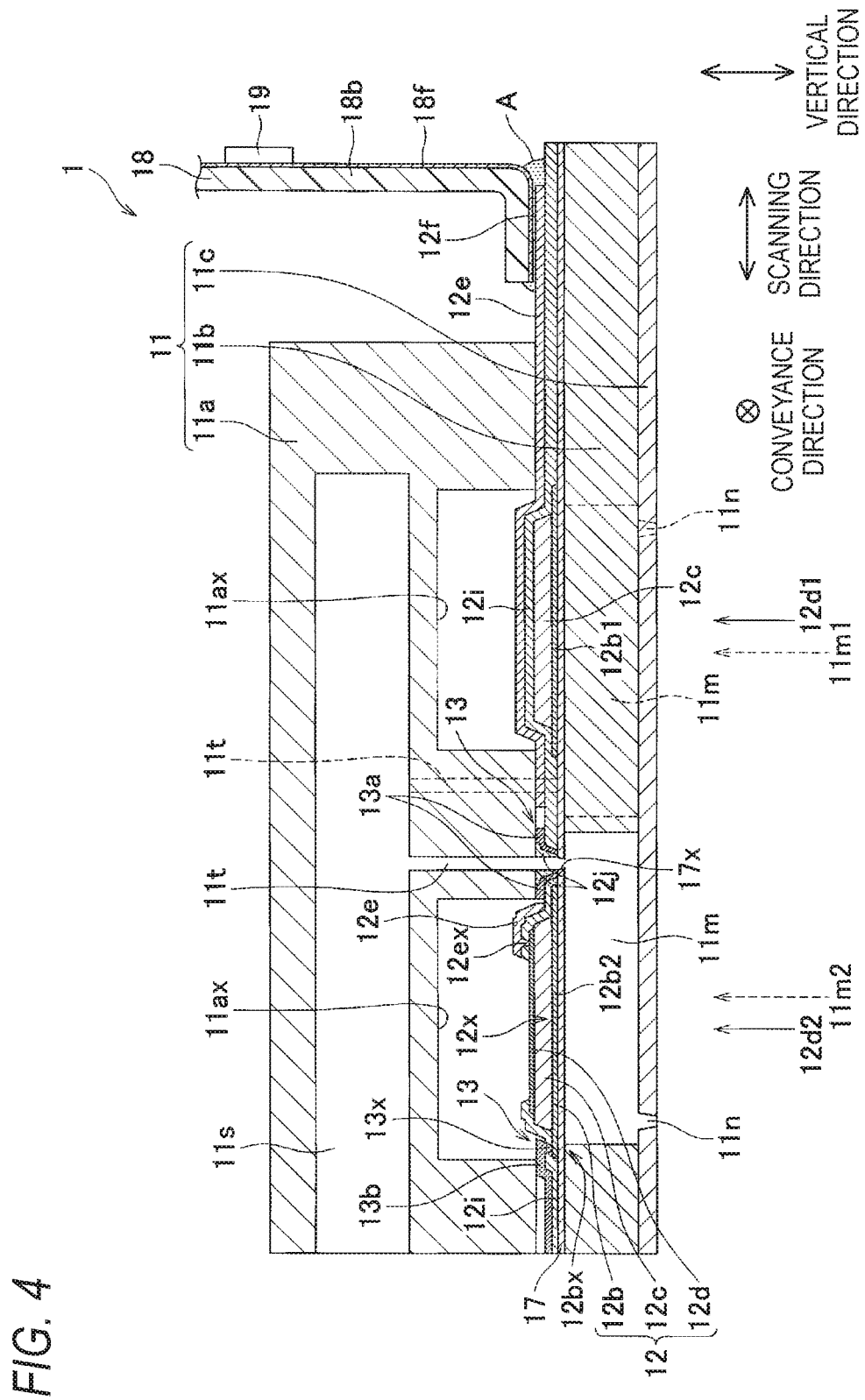
FIG. 4 is a cross-sectional view of the head taken along line IV-IV of FIG. 2.

The head 1 includes a channel substrate 11, a piezoelectric actuator 12, and a COF 18 as illustrated in FIGS. 2 and 4.

The channel substrate 11 includes a reservoir member 11a, a pressure chamber plate 11b, and a nozzle plate 11c as illustrated in FIG. 4. In FIG. 2, the reservoir member 11a is omitted.

A plurality of pressure chambers 11m are formed in the pressure chamber plate 11b. The plurality of nozzles 11n are formed in the nozzle plate 11c to communicate with the plurality of pressure chambers 11m respectively. A reservoir 11s which serves as a common channel to the plurality of pressure chambers 11m is formed in the reservoir member 11a. The reservoir 11s communicates with a tank (not illustrated) storing ink.

As illustrated in FIG. 2, the pressure chambers 11m are arranged in the conveyance direction and form four pressure chamber rows 11m1 to 11m4 which are aligned in the scanning direction. In each of the pressure chamber rows 11m1 to 11m4, the pressure chambers 11m are disposed at an equal interval in the conveyance direction. The pressure chambers 11m forming two pressure chamber rows 11m1 and 11m2 on a right side in FIG. 2 among four pressure chamber rows 11m1 to 11m4 are arranged in a staggered shape to be at different positions in the conveyance direction. The pressure chambers 11m forming two pressure chamber rows 11m3 and 11m4 on a left side in FIG. 2 among four pressure chamber rows 11m1 to 11m4 are arranged in a staggered shape to be at different positions in the conveyance direction.

The nozzles 11n are disposed in the conveyance direction similarly to the pressure chambers 11m as illustrated in FIG. 2 and form four nozzle rows which are aligned in the scanning direction. In each nozzle row, the nozzles 11n are disposed at an equal interval in the conveyance direction. The nozzles 11n forming two nozzle rows on the right side in FIG. 2 among four nozzle rows are arranged in a staggered shape to be at different positions in the conveyance direction. The nozzles 11n forming two nozzle rows on the left side in FIG. 2 in among four nozzle rows are arranged in a staggered shape to be at different positions in the conveyance direction.

The nozzle plate 11c is bonded to the lower surface of the pressure chamber plate 11b as illustrated in FIG. 4. In other words, the nozzle plate 11c is disposed on the opposite side to the piezoelectric actuator 12 with respect to the pressure chamber plate 11b.

The reservoir member 11a is bonded to the upper surface of the pressure chamber plate 11b through the piezoelectric actuator 12.

The reservoir 11s is added to the reservoir member 11a. A plurality of communication channels 11t which communicate with the reservoir 11s and the plurality of pressure chambers 11m, and four concave portions 11ax which extend in the conveyance direction are formed. The concave portion 11ax is formed on the lower surface of the reservoir member 11a, and faces the pressure chamber rows 11m1 to 11m4 in a vertical direction.

A diaphragm 17 is provided on the upper surface of the pressure chamber plate 11b. The diaphragm 17 is an insulating layer which is formed by oxidizing or nitrifying the surface of a silicon single-crystal substrate of the pressure chamber plate 11b, for example. The diaphragm 17 is disposed on the almost entire upper surface of the pressure chamber plate 11b. The diaphragm 17 is disposed between the piezoelectric actuator 12 and the pressure chamber plate 11b, and covers a plurality of pressure chambers 26.

In the diaphragm 17, a through-hole 17x is formed in a portion facing each communication channel 11t in the vertical direction. Ink in a tank is supplied to the reservoir 11s by driving a pump (not illustrated), and supplied to the respective pressure chambers 11m through the communication channel 11t and the through-hole 17x.

As illustrated in FIG. 4, the piezoelectric actuator 12 is disposed on the upper surface of the pressure chamber plate 11b through the diaphragm 17, and covers all the pressure chambers 11m formed in the pressure chamber plate 11b.

The piezoelectric actuator 12 includes a common electrode 12b, four piezoelectric elements 12c, and a plurality of discrete electrodes 12d in an ascending order.

In this embodiment, the vertical direction corresponds to "a thickness direction of the piezoelectric element 12c", the upper side in the vertical direction corresponds to "one side of the piezoelectric element 12c in the thickness direction", and the lower side in the vertical direction corresponds to "the other side of the piezoelectric element 12c in the thickness direction". The scanning direction corresponds to "second direction". "third direction", and "fourth direction", and the conveyance direction corresponds to "first direction" and "fifth direction". A horizontal direction containing the scanning direction and the conveyance direction corresponds to "surface direction of the piezoelectric element 12c".

The common electrode 12b is disposed on the upper surface of the diaphragm 17.

Figure 3:
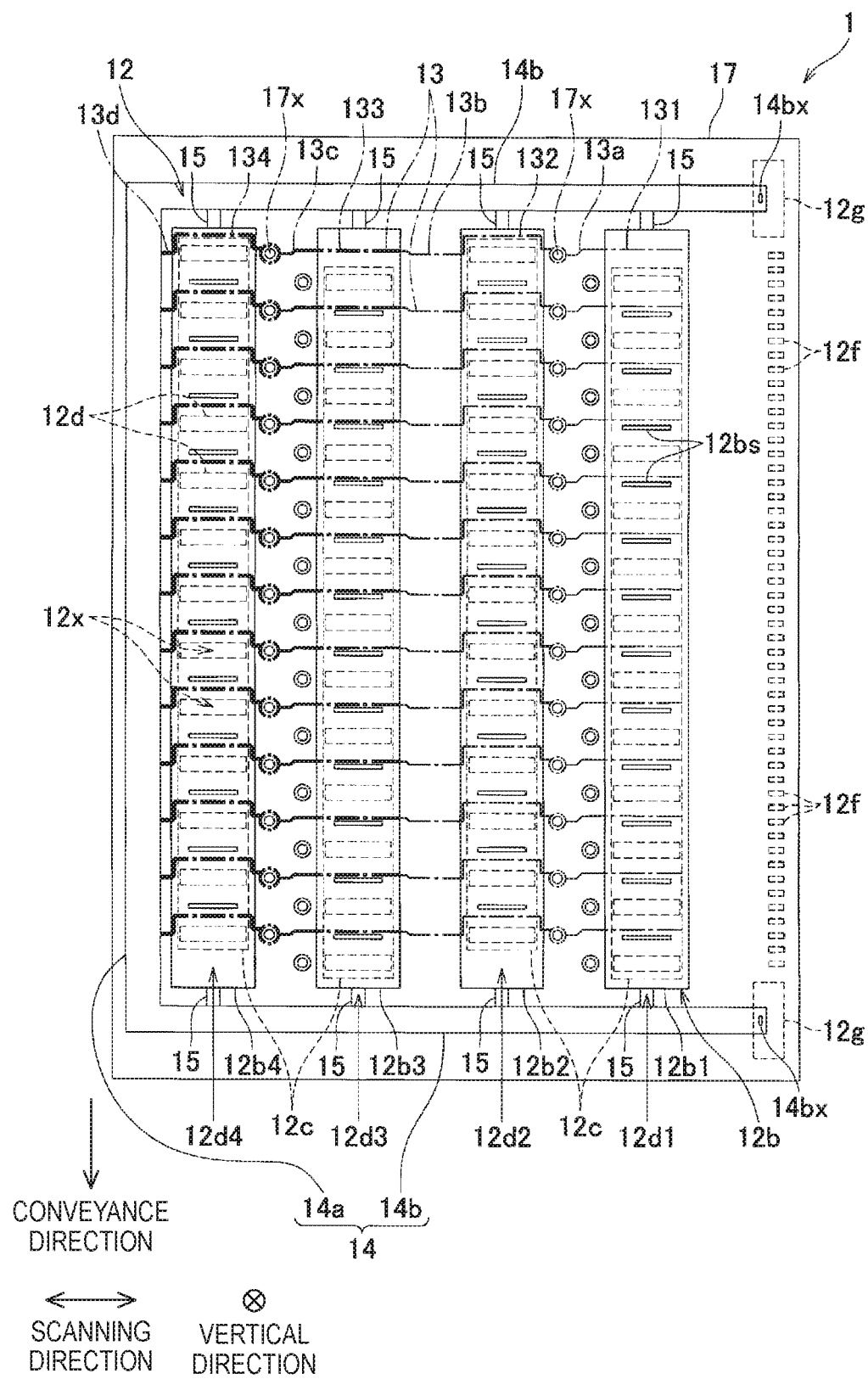
FIG. 3 is a plan view of the head illustrating a layer where a common electrode of a piezoelectric actuator is formed.
Figure 5:
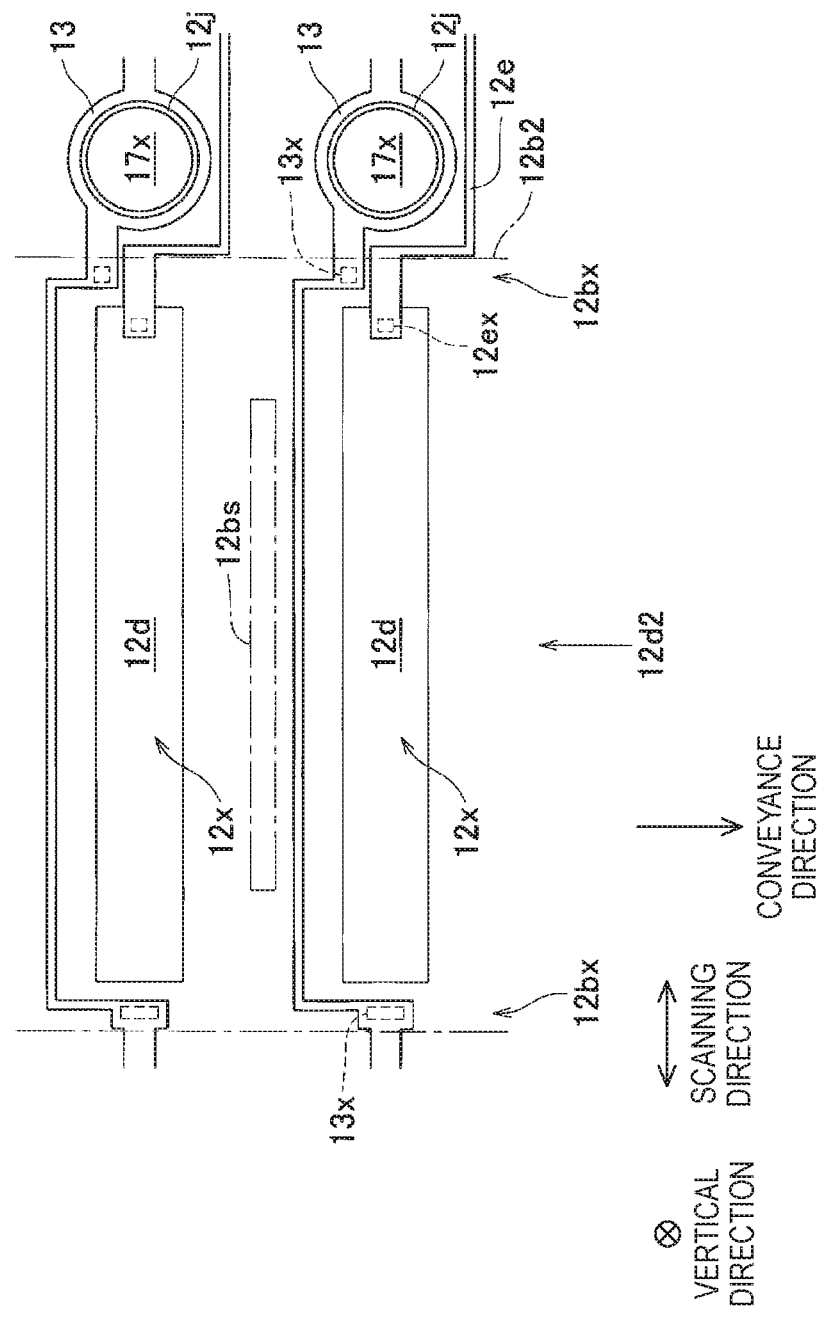
FIG. 5 is an enlarged view of a region V illustrated in FIG. 2.

The common electrode 12b includes a first common electrode 12b1, a second common electrode 12b2, a third common electrode 12b3, and a fourth common electrode 12b4 separated from each other in the scanning direction as illustrated in FIGS. 2 and 3. The common electrodes 12b1 to 12b4 are common electrodes for the plurality of pressure chambers 11m of the pressure chamber rows 11m1 to 11m4, and face the plurality of pressure chambers 11m of the pressure chamber rows 11m1 to 11m4 in the vertical direction. In other words, the common electrode 12b is divided into four parts in accordance with the pressure chamber rows 11m1 to 11m4. The common electrodes 12b1 to 12b4 include slits 12bs as illustrated in FIGS. 3 and 5. The slits 12bs are disposed in a portion facing a portion between the discrete electrodes 12d in the vertical direction, and extend in the scanning direction. The common electrodes 12b1 to 12b4 are made of platinum (Pt), for example.

The piezoelectric element 12c extends in the conveyance direction on the upper surface of each of the common electrodes 12b1 to 12b4 as illustrated in FIGS. 2 and 3, and covers all the pressure chambers 11m of each of the pressure chamber rows 11m1 to 11m4. The piezoelectric element 12c is made of lead zirconate titanate (PZT), for example.

A plurality of the discrete electrodes 12d are provided, and each discrete electrode is disposed on the upper surface of each piezoelectric element 12c and faces each pressure chamber 11m in the vertical direction.

In other words, the discrete electrode 12d is disposed on the upper side of the piezoelectric element 12c in the vertical direction. The common electrode 12b is disposed on the lower side of the piezoelectric element 12c in the vertical direction. The common electrode 12b faces the discrete electrode 12d in the vertical direction with the piezoelectric element 12c interposed therebetween.

The discrete electrodes 12d are arranged in the conveyance direction similarly to the pressure chambers 11m as illustrated in FIG. 2, and form four discrete electrode rows 12d1 to 12d4 which are aligned in the scanning direction. The plurality of discrete electrodes 12d forming each of the discrete electrode rows 12d1 to 12d4 face each of the common electrodes 12b1 to 12b4 in the vertical direction. The discrete electrodes 12d in each of the discrete electrode rows 12d1 to 12d4 are disposed at an equal interval in the conveyance direction. The discrete electrodes 12d forming two discrete electrode rows 12d1 and 12d2 on the right side in FIG. 2 among four discrete electrode rows 12d1 to 12d4 are arranged in a staggered shape to be at different positions in the conveyance direction. The discrete electrodes 12d forming two discrete electrode rows 12d3 and 12d4 on the left side in FIG. 2 among four discrete electrode rows 12d1 to 12d4 are arranged in a staggered shape to be at different positions in the conveyance direction.

A portion interposed between the discrete electrode 12d and the common electrode 12b in the piezoelectric element 12c serves as an active part 12x deformable according to a voltage applied to the discrete electrode 12d. In other words, the piezoelectric actuator 12 includes a plurality of the active parts 12x which face the plurality of pressure chambers 11m. When the active part 12x is driven according to a voltage applied to the discrete electrode 12d (for example, to be deformed to protrude toward the pressure chamber 11m), a volume of the pressure chamber 11m varies, a pressure is applied to the ink in the pressure chamber 11m, and the ink is discharged from the nozzle 11n.

The piezoelectric actuator 12 further includes a plurality of discrete wirings 12e, a plurality of discrete contacts 12f, two common contacts 12g, a plurality of connection wirings 13, a common wiring 14, and a plurality of coupling wirings 15. These wirings 12e, and 13 to 15 and the contacts 12f and 12g are made of the same material (for example, aluminum (Al)).

The discrete wiring 12e is provided for each discrete electrode 12d, and connects the discrete electrode 12d and the corresponding discrete contact 12f. The connection wiring 13 connects the common electrodes 12b1 to 12b4 to each other. The common wiring 14 connects the common electrodes 12b1 to 12b4 and the common contact 12g through the connection wiring 13.

The discrete contact 12f and the common contact 12g are disposed at positions facing a portion where the pressure chamber plate 11b is not covered with the reservoir member 11a as illustrated in FIG. 4.

The discrete contacts 12f and the common contacts 12g are arranged in a line in the conveyance direction on one side (right side of FIG. 2) in the scanning direction with respect to a group composed of all the discrete electrodes 12d provided in the piezoelectric actuator 12. The discrete contacts 12f are disposed at an equal interval in the conveyance direction. The plurality of discrete contacts 12f are interposed between the common contacts 12g in the conveyance direction.

The common wiring 14 includes a facing portion 14a positioned on the other side (left side of FIG. 2) in the scanning direction with respect to a group composed of all the discrete electrodes 12d provided in the piezoelectric actuator 12, and two connection portions 14b which extend from both sides (both ends of the facing portion 14a in the conveyance direction in this embodiment) of the facing portion 14a in the conveyance direction to one side (right side of FIG. 2) in the scanning direction so as to be connected to two common contacts 12g. The facing portion 14a and two connection portions 14b are integrally formed, and enclose the group of the discrete electrodes 12d together with a row of the plurality of discrete contacts 12f.

The facing portion 14a is formed as a rectangular portion extending in the conveyance direction. The connection portion 14b is formed as a rectangular portion extending in the scanning direction. The connection portion 14b is connected to the facing portion 14a at the end on the other side (left side of FIG. 2) in the scanning direction, and electrically connected to the common contact 12g through a portion (contact portion 14bx) which is inserted to a through-hole of an insulating film 12i (to be described below) at the end on one side (right side of FIG. 2) in the scanning direction. The connection portion 14b is coupled to the common electrodes 12b1 to 12b4 through the coupling wirings 15.

The common wiring 14 and the coupling wiring 15 have a width larger than those of the other wirings 12e and 13. The widths of the discrete wiring 12e and the connection wiring 13 are almost the same. The thicknesses of the wirings 12e and 13 to 15 are almost the same.

The row of the plurality of discrete contacts 12f and two common contacts 12g, the discrete electrode row 12d1, the discrete electrode row 12d2, the discrete electrode row 12d3, the discrete electrode row 12d4, and the facing portion 14a are sequentially disposed from the right side of FIG. 2 in the scanning direction.

In other words, the plurality of discrete contacts 12f are disposed on the opposite side to the discrete electrode rows 12d2 to 12d4 in the scanning direction with respect to the discrete electrode row 12d1, disposed on the opposite side to the discrete electrode rows 12d3 and 12d4 in the scanning direction with respect to the discrete electrode row 12d2, and disposed on the opposite side to the discrete electrode row 12d4 in the scanning direction with respect to the discrete electrode row 12d3.

The discrete electrode 12d forming the discrete electrode row 12d2 is disposed at a position away from the discrete contact 12f in the scanning direction, as compared with the discrete electrode 12d forming the discrete electrode row 12d1. The discrete electrode 12d forming the discrete electrode row 12d3 is disposed at a position away from the discrete contact 12f in the scanning direction, as compared with the discrete electrode 12d forming the discrete electrode rows 12d1 and 12d2. The discrete electrodes 12d forming the discrete electrode row 12d4 are disposed at positions away from the discrete contacts 12f in the scanning direction, as compared with the discrete electrodes 12d forming the discrete electrode rows 12d1 to 12d3.

The discrete wiring 12e and the connection wiring 13 each extend in the scanning direction. The discrete wiring 12e includes a contact portion 12ex (see FIG. 4) contacting the corresponding discrete electrode 12d at one end in the scanning direction, and the discrete contact 12f at the other end in the scanning direction.

The discrete wirings 12e connecting to the discrete electrodes except the discrete electrodes positioned at both ends in the conveyance direction among the discrete electrodes 12d of the discrete electrode row 12d4 extend in the scanning direction through between two discrete electrodes 12d adjacent in the conveyance direction in the discrete electrode rows 12d1 to 12d3. The discrete wirings 12e connecting to the discrete electrodes except the discrete electrodes positioned at both ends in the conveyance direction among the discrete electrodes 12d of the discrete electrode row 12d3 extend in the scanning direction through between two discrete electrodes 12d adjacent in the conveyance direction in the discrete electrode rows 12d1 and 12d2. The discrete wirings 12e connecting to the discrete electrode except the discrete electrodes positioned at both ends in the conveyance direction among the discrete electrodes 12d of the discrete electrode row 12d2 extend in the scanning direction through between two discrete electrodes 12d adjacent in the conveyance direction in the discrete electrode row 12d1.

The connection wirings except the connection wirings positioned at both ends in the conveyance direction among the plurality of connection wirings 13 extend in the scanning direction through between two discrete electrodes 12d adjacent in the conveyance direction in the discrete electrode rows 12d1 to 12d3.

Therefore, in the discrete electrode row 12d3, one discrete wiring 12e and one connection wiring 13 are disposed between two discrete electrodes 12d adjacent in the conveyance direction. In the discrete electrode row 12d2, two discrete wirings 12e and one connection wiring 13 are disposed between two discrete electrodes 12d adjacent in the conveyance direction. In the discrete electrode row 12d1, three discrete wirings 12e and one connection wiring 13 are disposed between two discrete electrodes 12d adjacent in the conveyance direction.

The connection wiring 13 includes a first transverse portion 131 which extends from one end to the other end in the scanning direction in the first common electrode 12b1, a second transverse portion 132 which extends from one end to the other end in the scanning direction of the second common electrode 12b2, a third transverse portion 133 which extends from one end to the other end in the scanning direction of the third common electrode 12b3, and a fourth transverse portion 134 which extends from one end to the other end in the scanning direction of the fourth common electrode 12b4. The connection wiring 13 further includes a first connection part 13a which is disposed between the first common electrode 12b1 and the second common electrode 12b2 to connect the first transverse portion 131 and the second transverse portion 132, a second connection part 13b which is disposed between the second common electrode 12b2 and the third common electrode 12b3 to connect the second transverse portion 132 and the third transverse portion 133, a third connection part 13c which is disposed between the third common electrode 12b3 and the fourth common electrode 12b4 to connect the third transverse portion 133 and the fourth transverse portion 134, and a fourth connection part 13d which is disposed between the fourth common electrode 12b4 and the facing portion 14a to connect the fourth transverse portion 134 and the facing portion 14a.

The thickness of the connection wiring 13 is constant, and the width becomes large as it goes from one side (right side of FIG. 2) to the other side (left side of FIG. 2) in the scanning direction (that is, as the connection wiring goes away from the row of the discrete contacts 12f). Specifically, the fourth connection part 13d and the fourth transverse portion 134 have the same width. The third connection part 13c and the third transverse portion 133 have the same width. The second connection part 13b and the second transverse portion 132 have the same width. The first connection part 13a and the first transverse portion 131 have the same width. The widths of the fourth connection part 13d and the fourth transverse portion 134 are larger than those of the third connection part 13c and the third transverse portion 133. The widths of the third connection part 13c and the third transverse portion 133 are larger than those of the second connection part 13b and the second transverse portion 132. The widths of the second connection part 13b and the second transverse portion 132 are larger than that of the first connection part 13a and the first transverse portion 131.

The connection wiring 13 is formed in an annular shape to enclose the through-hole 17x as illustrated in FIGS. 2 to 5 (in particular, FIG. 5). In the connection wiring 13, an insulating portion 12j is provided to define a channel which connects the communication channel 11t and the through-hole 17x inside the annular portion (see FIGS. 4 and 5). With the insulating portion 12j, the connection wiring 13 can be set away from the ink passing through the through-hole 17x. The insulating portion 12j is made of silicon dioxide (SiO₂), for example.

In this embodiment, the insulating film 12i (not illustrated in FIG. 2; see FIG. 4) is provided in order to increase insulation between the discrete wiring 12e and the common electrode 12b. The insulating film 12i is disposed on the almost entire upper surface of the diaphragm 17, and covers the common electrodes 12b1 to 12b4, the piezoelectric element 12c, the common wiring 14, and the coupling wiring 15. However, the insulating film 12i covers only the outer edge of the discrete electrode 12d not to hinder the driving of the active part 12x. The center portion of the discrete electrode 12d is exposed from the insulating film 12i. The insulating film 12i is made of silicon dioxide (SiO₂), for example.

The discrete wiring 12e, the connection wiring 13, the discrete contact 12f, and the common contact 12g are disposed on the upper surface of the insulating film 12i. In other words, the discrete wiring 12e, the connection wiring 13, the discrete contact 12f, and the common contact 12g are positioned in the same layer.

The common wiring 14 and the coupling wiring 15 are disposed on the upper surface of the diaphragm 17 and on the lower side of the insulating film 12i similarly to the common electrode 12b. In other words, the common electrode 12b, the common wiring 14, and the coupling wiring 15 are disposed in the same layer.

The discrete wiring 12e is electrically connected to each of the discrete electrodes 12d through a portion (contact portion 12ex) which is inserted to the through-hole of the insulating film 12i. The connection wiring 13 is electrically connected to each of the common electrodes 12b1 to 12b4 through a portion (contact portion 13x) which is inserted to the through-hole of the insulating film 12i.

The contact portion 12ex is provided at the end on one side (right side of FIGS. 2 to 5) in the scanning direction in the discrete electrode 12d.

The contact portion 13x is provided at each ends on one side (right side of FIG. 5) and on the other side (left side of FIG. 5) in the scanning direction in each of the common electrodes 12b1 to 12b4. In other words, the connection wiring 13 includes a plurality of contact portions 13x contacting the common electrodes 12b1 to 12b4. These contact portions 13x are provided at an outer edge 12bx which extends in a straight line along the conveyance direction in the common electrodes 12b1 to 12b4.

The COF 18 includes an insulating sheet 18b made of polyimide or the like, a plurality of discrete wirings 18f which is electrically connected to the discrete contact 12f, and two common wirings (not illustrated) which are electrically connected to the common contacts 122 as illustrated in FIG. 4.

One end of the COF 18 is bonded to the channel substrate 11 through an adhesive A in a state where the discrete wiring 18f and the common wiring each face the discrete contact 12f and the common contact 12g. The other end of the COF 18 is electrically connected to the controller 5 (see FIG. 1).

The driver IC 19 is mounted between the one end and the other end of the COF 18. The driver IC 19 generates a drive signal to drive the active part 12x on the basis of a signal from the controller 5, and supplies the drive signal to the discrete electrodes 12d. The potential of the common electrode 12b is kept to the ground potential. When the drive signal is supplied, the potential of the discrete electrode 12d varies between a predetermined drive potential and the ground potential.

When the potential of the discrete electrode 12d varies from the ground potential to the drive potential, a potential difference between the discrete electrode 12d and the common electrode 17b is generated. With this potential difference, an electric field is operated on the active part 12x in parallel to the thickness direction of the piezoelectric element 12c. At this time, a polarization direction (the thickness direction of the piezoelectric element 12c) of the active part 12x is matched to the direction of the electric field. Therefore, the active part 12x extends in the thickness direction of the piezoelectric element 12c, and is shrunk in the surface direction of the piezoelectric element 12c. With the shrinkage deformation of the active part 12x, a portion facing the pressure chamber 11m in the diaphragm 17 and the piezoelectric actuator 12 is deformed to protrude toward the pressure chamber 11m. With this configuration, the volume of the pressure chamber 11m is reduced, energy is applied to the ink in the pressure chamber 11m, and an ink droplet is discharged from the nozzle 11n which communicates with the pressure chamber 11m.

Next, a manufacturing method of the piezoelectric actuator 12 will be described with reference to FIGS. 6 to 9.

In this embodiment, before manufacturing the piezoelectric actuator 12, the surface of the silicon single-crystal substrate serving as the pressure chamber plate 11b is oxidized or nitrified, so that the diaphragm 17 is formed on the upper surface of the pressure chamber plate 11b. In this stage, the pressure chamber 11m is not formed in the silicon single-crystal substrate serving as the pressure chamber plate 11b, and the through-hole 17x of the diaphragm 17 is also not formed.

Figure 7:
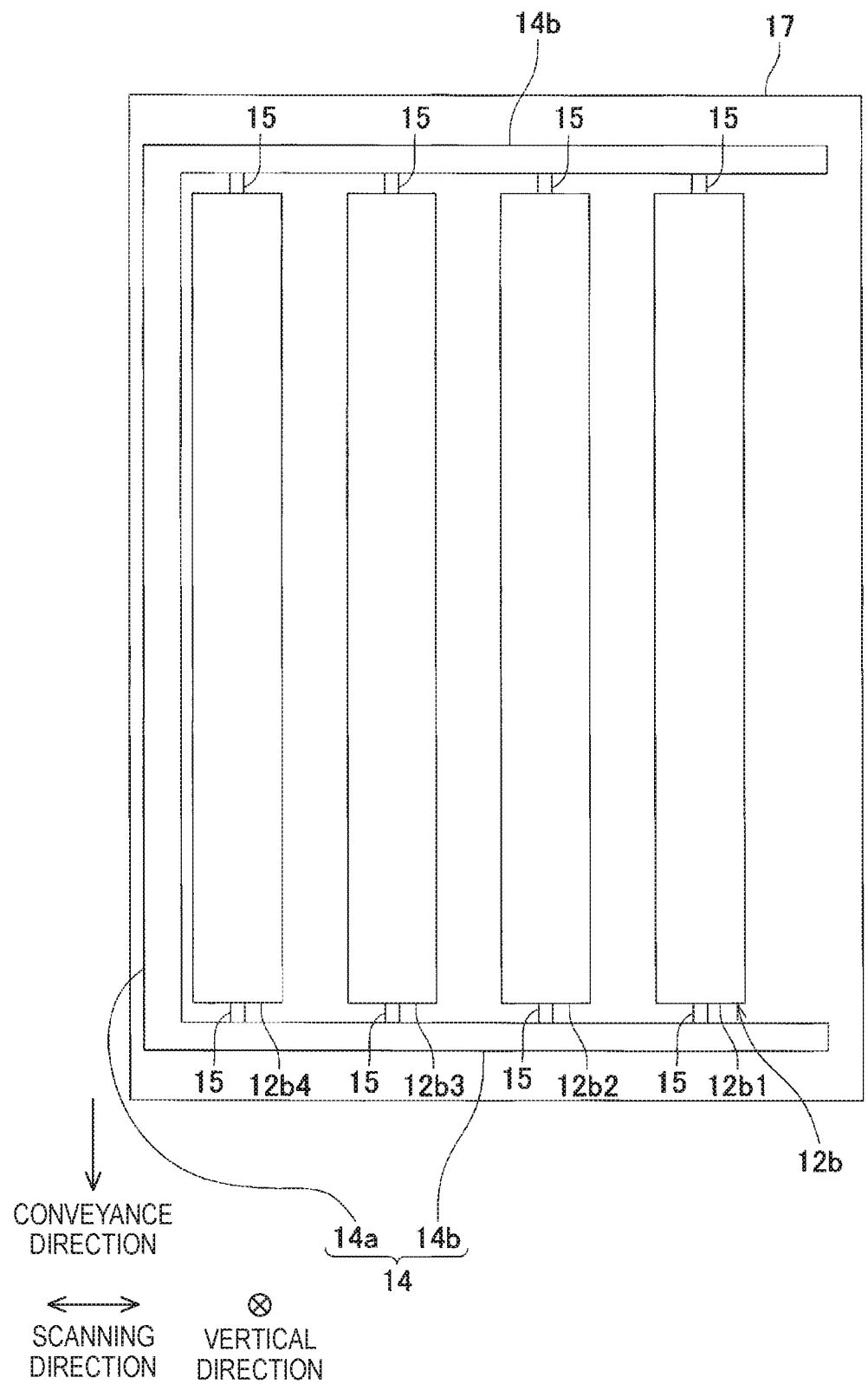
FIG. 7 is a plan view of the head illustrating a state where common electrodes, a common wiring, and a coupling wiring are formed in S1 of FIG. 6.

The common electrodes 12b1 to 12b4, the common wiring 14, and the coupling wiring 15 are formed on the upper surface of the diaphragm 17, for example, due to film formation by sputtering or patterning by etching (S1: see FIG. 7).

Figure 8:
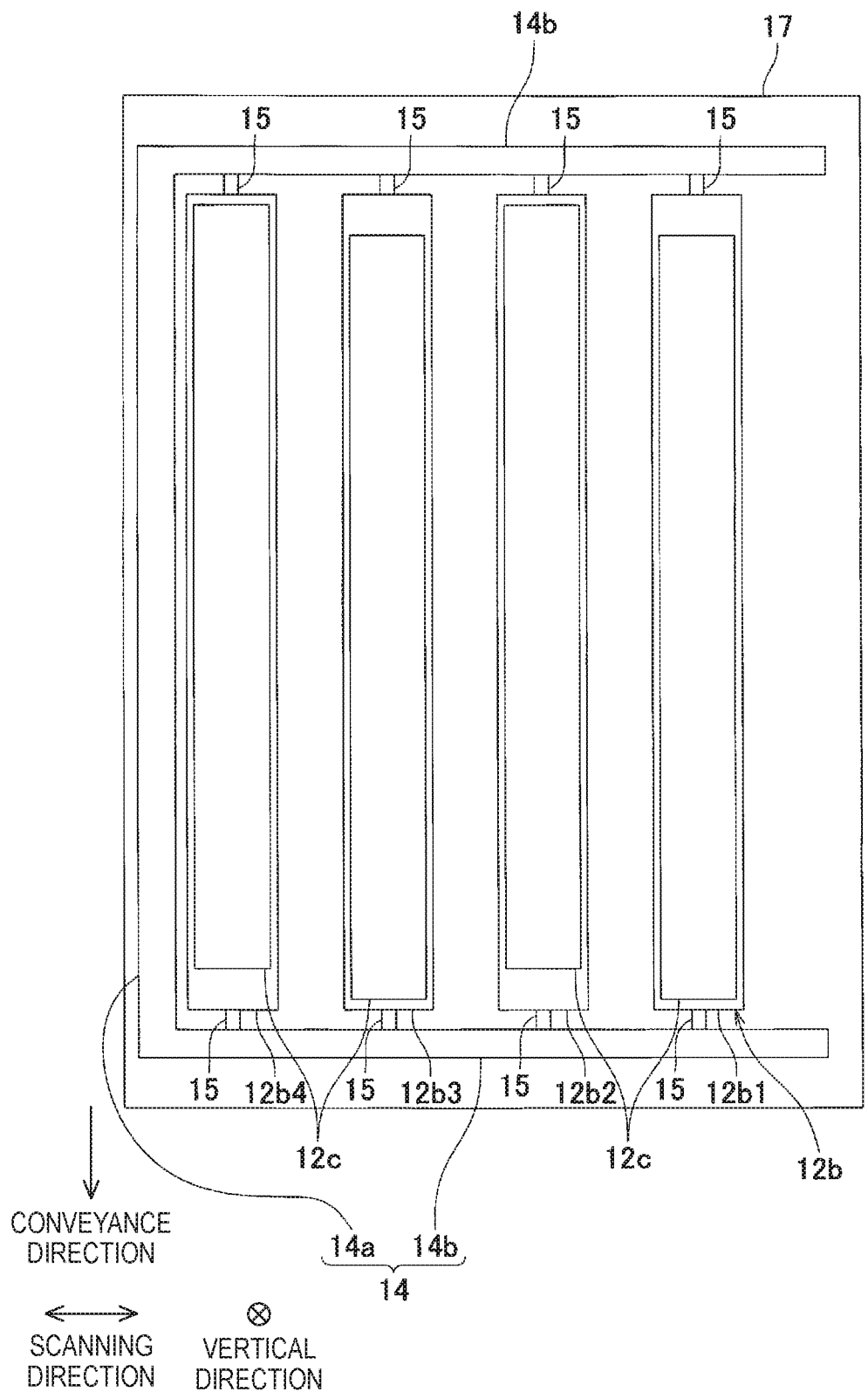
FIG. 8 is a plan view of the head illustrating a state where a piezoelectric element is formed in S2 of FIG. 6.

After S1, the piezoelectric element 12c is formed on the upper surface of each of the common electrodes 12b1 to 12b4 (S2: see FIG. 8). At this time, for example, a continuous layer serving as the piezoelectric element 12c is formed first on the upper surface of the diaphragm 17 to cover the common electrodes 12b1 to 12b4, the common wiring 14, and the plurality of coupling wirings 15 using a sol-gel method or the sputtering. Thereafter, a portion facing the common electrodes 12b1 to 12b4 is etched to remain the layer serving as the piezoelectric element 12c, thereby forming the piezoelectric element 12c.

Figure 9:
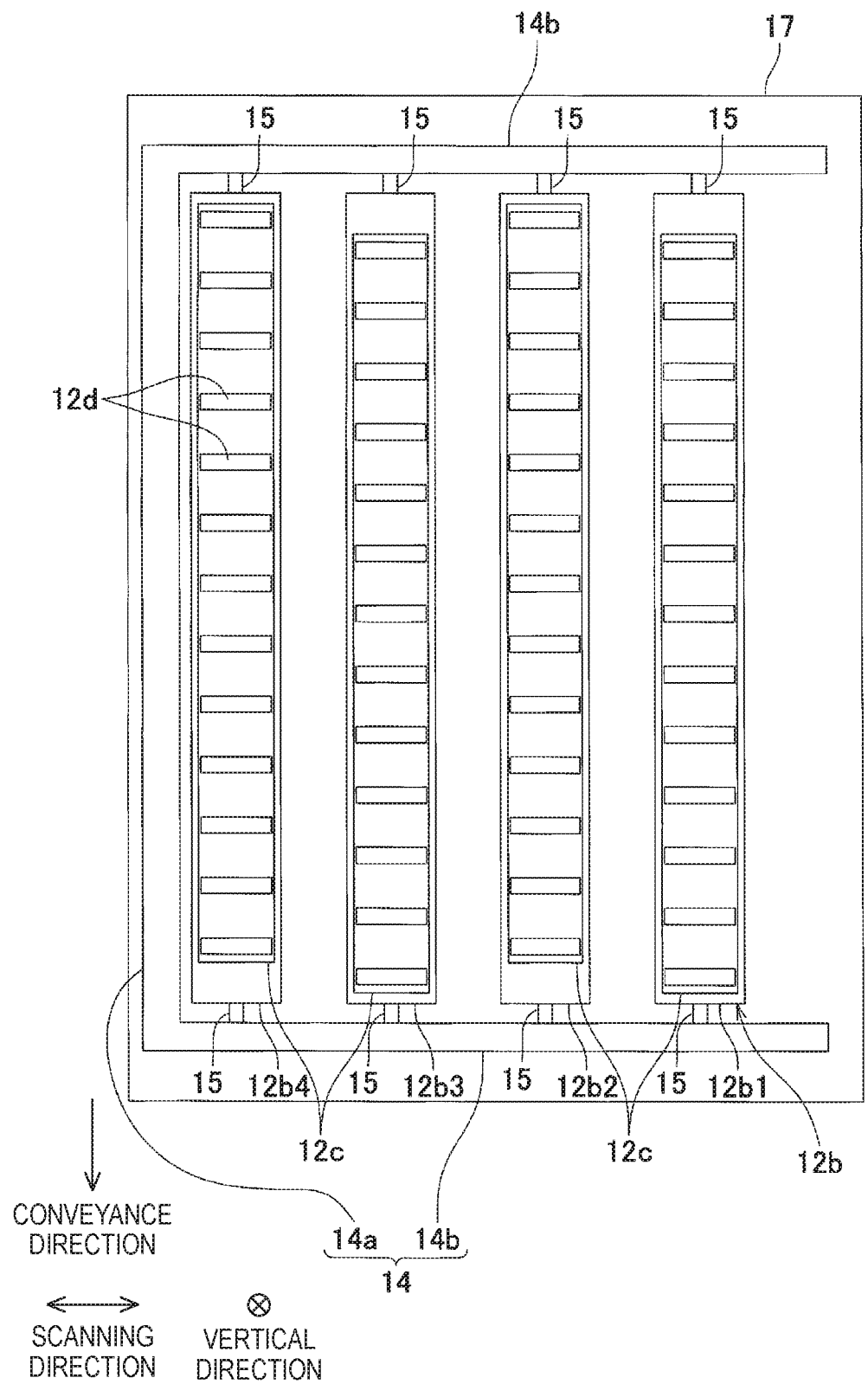
FIG. 9 is a plan view of the head illustrating a state where a discrete electrode is formed in S3 of FIG. 6.

After S2, the plurality of discrete electrodes 12d are formed on the upper surface of the piezoelectric elements 12c using a mask (S3: see FIG. 9).

After S3, the insulating film 12i is formed on the upper surface of the diaphragm 17 to cover the common electrodes 12b1 to 12b4, the piezoelectric element 12c, the common wiring 14, and the coupling wiring 15 by the sputtering (S4: see FIG. 4).

After S4, the through-holes corresponding to the contact portions 12ex, 13x, and 14bx (see FIGS. 3 and 4) and the openings to expose the discrete electrodes 12d are formed in the insulating film 12i by the etching (S5).

After S5, the through-holes are filled with a conductive material to form the contact portions 12ex, 13x, and 14bx (S6: see FIGS. 3 and 4).

After S6, the discrete wiring 12e, the connection wiring 13, the discrete contact 12f, and the common contact 12g are formed (S7: see FIG. 2). At this time, for example, an aluminum (Al) film is first formed on the almost entire upper surface of the insulating film 12i by the sputtering. Next, part of the film is partially removed by a wet etching so as to form the discrete wiring 12e, the connection wiring 13, the discrete contact 12f, and the common contact 12a at the same time. For example, in a case where the discrete wiring 12e, the connection wiring 13, the discrete contact 12f, and the common contact 12g are formed of gold (Au), a gold (Au) film is formed using a mask in a region uncovered with the mask by a plating method, so that the discrete wiring 12e, the connection wiring 13, the discrete contact 12f, and the common contact 12g may be formed at the same time.

With the above procedure, the piezoelectric actuator 12 is completed. Thereafter, the reservoir member 11a is bonded to the surface of the silicon single-crystal substrate serving as the pressure chamber plate 11b. After the silicon single-crystal substrate is polished down to have a predetermined thickness, the etching is performed from the lower surface of the silicon single-crystal substrate to form the plurality of pressure chambers 11m. At this stage, the silicon single-crystal substrate becomes the pressure chamber plate 11b. Further, after the through-hole 17x is formed in the diaphragm 17, the nozzle plate 11c is bonded to the lower surface of the pressure chamber plate 11b, and one end of the COF 18 is bonded to the channel substrate 11 through the adhesive A. Therefore, the head 1 is completed.

As described above, according to this embodiment, the common electrode 12b includes the first common electrode 12b1 facing the discrete electrode 12d of the discrete electrode row 12d1, the second common electrode 12b2 facing the discrete electrode 12d of the discrete electrode row 12d2, the third common electrode 12b3 facing the discrete electrode 12d of the discrete electrode row 12d3, and the fourth common electrode 12b4 facing the discrete electrode 12d of the discrete electrode row 12d4 (see FIG. 3). In this case, as compared with a case where the common electrode 12b is formed to face all the discrete electrodes 12d formed in the head 1, a residual stress caused by the formation of the common electrode 12b is decreased, and warpage of the piezoelectric actuator 12 can be suppressed. In this embodiment, the distance from the discrete contacts 12f in the discrete electrode rows 12d1 to 12d4 differs. Therefore, an applying voltage may be deviated. For this reason, the connection wiring 13 is provided to connect the common electrodes 12b1 to 12b4 to each other. With the connection wiring 13, a channel where the current flows between the common electrode 12b and the common contact 12g is increased, and a total electric resistance between the common electrode 12b and the common contact 12g is lowered. With this configuration, a voltage drop hardly occurs, and the deviation in applying voltage caused by the different distance from the discrete contacts 12f in the plurality of discrete electrodes 12d can be suppressed.

The common electrodes 12b1 to 12b4 are provided in the discrete electrode rows 12d1 to 12d4 respectively. In this case, warpage of the piezoelectric actuator 12 can be suppressed with a simple configuration.

In the discrete wirings 12e, the discrete wiring 12e connected to the discrete electrode except the discrete electrodes positioned at both ends in the conveyance direction among the discrete electrodes 12d of the discrete electrode rows 12d2 to 12d4 extends in the scanning direction through between two discrete electrodes 12d adjacent in the conveyance direction in the discrete electrode row positioned closer to the discrete contact 12f as compared with the discrete electrode row (see FIG. 2). In this case, the piezoelectric actuator 12 can be avoided from being increased in size, as compared with a case where the discrete wiring 12e extends to the outer side of a group composed of the plurality of discrete electrodes 12d.

Even in the connection wirings 13, the connection wiring except the connection wirings positioned at both ends in the conveyance direction extends in the scanning direction through between two discrete electrodes 12d adjacent in the conveyance direction in each of the discrete electrode rows 12d1 to 12d3 (see FIG. 2). In this case, the piezoelectric actuator 12 can be avoided from being increased in size, as compared with a case where the connection wiring 13 extends to the outer side of a group composed of the plurality of discrete electrodes 12d.

The discrete wiring 12e and the connection wiring 13 are formed in the same layer (see FIGS. 2 and 4). In this case, the discrete wiring 12e and the connection wiring 13 are easily formed in one process, and a special process for forming the connection wiring 13 can be omitted (see S7 of FIG. 6). Therefore, it is possible to suppress an increase in the number of processes for manufacturing the piezoelectric actuator 12.

The discrete wiring 12e and the connection wiring 13 are made of the same material (for example, aluminum (Al)). In this case, it is possible to easily realize that the discrete wiring 12e and the connection wiring 13 are formed in one process, and a special process for forming the connection wiring 13 is omitted (see S7 of FIG. 6). Therefore, it is possible to further securely suppress an increase in the number of processes for manufacturing the piezoelectric actuator 12.

The contact portion 12ex for the discrete electrode 12d in the discrete wiring 12e is at the end on one side (right side of FIG. 5) in the scanning direction. The contact portion 13x for each of the common electrodes 12b1 to 12b4 in the connection wiring 13 is on the other side (left side of FIG. 5) in the scanning direction. In this case, a channel from the discrete electrode 12d to the discrete contact 12f through the discrete wiring 12e, and a channel from each of the common electrodes 12b1 to 12b4 to the facing portion 14a of the common wiring 14 through the connection wiring 13 can be made short. With this configuration, it is possible to reduce loads on the discrete wiring 12e and the connection wiring 13.

The connection wiring 13 includes a plurality of the contact portions 13x for each of the common electrodes 12b1 to 12b4 (see FIG. 5). In this case, it is possible to prevent that the current is concentrated onto the contact portion 13x, as compared with a case where only one contact portion 13x is provided.

The contact portion 13x is provided at the outer edge 12bx which extends in a straight line along the conveyance direction in each of the common electrodes 12b1 to 12b4 (see FIG. 5). In a case where the contact portions 13x are provided in the projection formed in each of the common electrodes 12b1 to 12b4, the current is concentrated onto the contact portions 13x, and thus the electric resistance of each of the common electrodes 12b1 to 12b4 is increased. According to the above configuration, such a problem can be suppressed.

The common wiring 14 includes the facing portion 14a which is positioned on the other side (left side of FIG. 2) in the scanning direction with respect to a group composed of the plurality of discrete electrodes 12d, and two connection portions 14b which extend from both sides (in this embodiment, both ends in the conveyance direction of the facing portion 14a) in the conveyance direction of the facing portion 14a toward one side (right side of FIG. 2) in the scanning direction and are connected to two common contacts 12g. In this case, since the common wiring 14 includes the facing portion 14a, a channel from the common electrode 12b to the common contact 12Q through the common wiring 14 is made long. With this configuration, it is possible to further lower the entire electric resistance between the common electrode 12b and the common contact 12g.

Each of the common electrodes 12b1 to 12b4 and the connection portion 14b are connected by the coupling wiring 15. In this case, since not only the connection wiring 13 but also the coupling wiring 15 is provided, a channel where the current flows between the common electrode 12b and the common contact 12g is further increased, and the entire electric resistance between the common electrode 12b and the common contact 12g is further lowered. With this configuration, a voltage drop more hardly occurs, and the deviation in applying voltage caused by a different distance from the discrete contacts 12f in the plurality of discrete electrodes 12d can be further securely suppressed.

At a portion facing a portion between the discrete electrodes 12d in the vertical direction, each of the common electrodes 12b1 to 12b4 includes the slit 12bs extending in the scanning direction (see FIGS. 3 and 5). In this case, with the slit 12bs, warpage of the piezoelectric actuator 12 can be further suppressed, and a displacement amount of the active part 12x can be increased.

The width of the connection wiring 13 becomes large from one side (right side of FIG. 2) in the scanning direction (right side of FIG. 2) toward the other side (left side of FIG. 2) (that is, as it goes away from the row of the discrete contacts 12f). The thickness of the connection wiring 13 is constant. Therefore, a cross-sectional area of the connection wiring 13 becomes large as it goes away from the row of the discrete contacts 12f. As a portion goes away from the row of the discrete contacts 12f in the connection wiring 13, a large current flows for driving the active part 12x. Therefore, a cross-sectional area of the portion is made large, so that reliability can be increased. As a portion goes away from the row of the discrete contacts 12f in the connection wiring 13, the number of neighboring discrete wirings 12e is reduced, so that the width can be made large.

The electric resistance of a material of the connection wiring 13 (for example, in the case of aluminum (Al), about $2.8 \times 10^{-8}$ Ωm) is lower than that of a material of the common electrodes 12b1 to 12b4 (for example, in the case of platinum (Pt), about $1.0 \times 10^{-7}$ Ωm). In this case, the entire electric resistance of the common electrode 12b can be lowered.

The connection wiring 13 extends from one end to the other end in the scanning direction in each of the common electrodes 12b1 to 12b4. In this case, since the connection wiring 13 having a low electric resistance traverses each of the common electrodes 12b1 to 12b4, the entire electric resistance of the common electrode 12b can be further lowered.

The connection wiring 13 includes the transverse portions 131 to 134 which extend from one end to the other end in the scanning direction in each of the common electrodes 12b1 to 12b4, and the connection parts 13a to 13c which are disposed between the common electrodes 12b1 to 12b4 and are connected to the transverse portions 131 to 134. In this case, the connection wiring 13 having a low electric resistance traverses each of the common electrodes 12b1 to 12b4, and the transverse portions 131 to 134 of the common electrodes 12b1 to 12b4 are connected through the connection parts 13a to 13c, so that the entire electric resistance of the common electrode 12b can be further lowered.

The connection wiring 13 is formed in an annular shape to enclose the through-hole 17x formed in the diaphragm 17 (see FIGS. 2, 3, and 5). In this case, the area of the connection wiring 13 can be made large. The discrete wiring 12e having a high potential can be set away from the ink passing through the through-hole 17x.

Modifications

Hitherto, while preferred embodiments of this disclosure have been described, this disclosure is not limited to the above-described embodiments, and various modifications may be made within a scope not departing from the scope of claims.

The configuration of channels in a liquid discharge head may be changed arbitrarily. For example, the reservoir has been described to be disposed on the opposite side (upper side) to the nozzle with respect to the pressure chamber in the above-described embodiments. However, the reservoir may be provided on the same side (lower side) as the nozzle with respect to the pressure chamber. The layout of the nozzle and the pressure chamber is arbitrary. For example, the nozzle and the pressure chamber may be disposed randomly without aligning in a line.

The discrete electrode may be disposed on the lower side of the piezoelectric element in the vertical direction, and the common electrode may be disposed on the upper side of the piezoelectric element in the vertical direction.

The number of discrete electrode rows is not limited to 4, and may be set to any number, for example, 2 or more. The discrete electrodes may be disposed randomly without aligning in a line.

The common electrode is not limited to be provided one by one for one discrete electrode row. However, the common electrode may be provided one by one for two discrete electrode rows or more. Alternatively, a plurality of common electrodes may be provided for one discrete electrode row.

The common electrode may be not provided with the slit.

The coupling wiring may be omitted.

The second common electrode is not limited to be completely separated from the first common electrode, but may have a portion connected to the first common electrode.

The discrete wiring and/or the connection wiring is not limited to extend through between two discrete electrodes, but may extend to the outer side of a group composed of the plurality of discrete electrodes.

The discrete wiring and the connection wiring may be formed in layers different from each other. The discrete wiring and the connection wiring may be made of materials different from each other.

A material of the discrete wiring and the connection wiring is not limited to aluminum (Al), but may be an aluminum alloy (Al—Cu) and gold (Au).

A material of the common electrode is not limited to platinum (Pt), but may be iridium (Ir).

The connection wiring may be configured not to extend from one end to the other end of the common electrode.

In the above-described embodiments, the thickness of the connection wiring is constant, and the width of the connection wiring becomes large as it goes away from the discrete contact, but this disclosure is not limited thereto. For example, the width of the connection wiring is constant, and the thickness of the connection wiring may become large as it goes away from the discrete contact. The cross-sectional area of the connection wiring may be constant in an extending direction of the connection wiring.

The contact portion for the common electrode in the connection wiring may be provided only by one. A position of the contact portion for the common electrode in the connection wiring, and a position of the contact portion for the discrete electrode in the discrete wiring may be not particularly limited. For example, the contact portion for the common electrode in the connection wiring may be provided in the projection provided in the common electrode.

Figure 6:
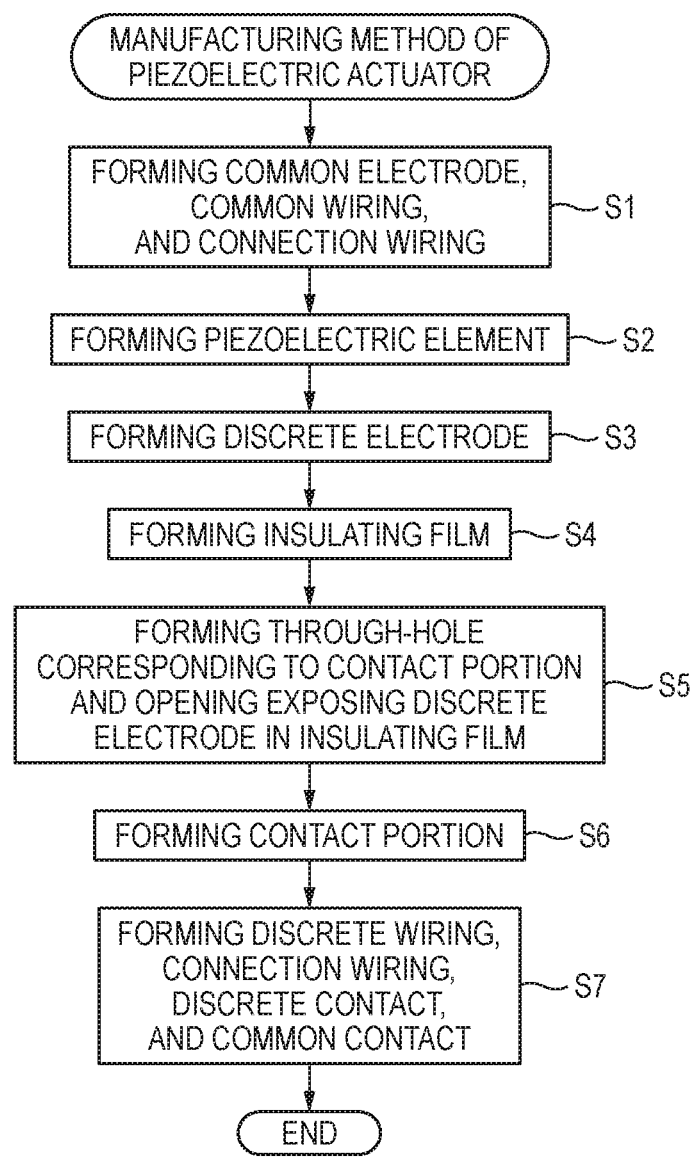
FIG. 6 is a flowchart illustrating a manufacturing method of the piezoelectric actuator 12.

The manufacturing method of the piezoelectric actuator is not limited to the method illustrated in FIG. 6. For example, in the above-described embodiments, the diaphragm 17 corresponding to an insulating layer is formed in the substrate serving as the pressure chamber plate 11b in a state where the pressure chamber is not formed, and the piezoelectric actuator 12 is formed thereon. However, this disclosure is not limited to the above structure, and the diaphragm 17 may be formed after the pressure chamber is formed in the substrate serving as the pressure chamber plate 11b, and the piezoelectric actuator 12 may be formed thereon. The discrete wiring and the connection wiring may not be formed in one process.

The liquid discharge head is not limited to a serial type, and may be formed in a line type (that is, the liquid is discharged to a recording medium in a state where the position is fixed).

The liquid discharged from the nozzle is not limited to ink, and may be any type of liquid (for example, a treatment liquid obtained by aggregating or precipitating a component in ink).

The recording medium is not limited to a paper sheet, and may be any type of media (for example, clothes) which is recordable.

This disclosure is not limited to a printer, and is applicable even to a facsimile, a copying machine, and a multifunction machine. This disclosure is applicable even to a liquid discharge device (for example, a liquid discharge device which discharges a conductive liquid to a substrate to form a conductive pattern) which is used for another purpose other than an image recording.

The piezoelectric actuator of this disclosure is not limited to one which is applied to a liquid discharge device, and is applicable to any actuator device (for example, an actuator device which moves a solid object, an actuator device which pressurizes an air, and a liquid crystal panel).

What is claimed is:

1. A piezoelectric actuator comprising:
 a piezoelectric element;
 a plurality of discrete electrodes, which is disposed on one side of the piezoelectric element in a thickness direction of the piezoelectric element;
 a common electrode, which is disposed on another side of the piezoelectric element in the thickness direction of the piezoelectric element, and faces the plurality of discrete electrodes in the thickness direction with the piezoelectric element interposed therebetween;
 a plurality of discrete contacts, which are respectively connected to the plurality of discrete electrodes, and
 a common contact, which is connected to the common electrode,
 wherein the plurality of discrete electrodes include:
  a first discrete electrode; and
  a second discrete electrode, which is disposed at a position away from a corresponding discrete contact among the plurality of discrete contacts in a surface direction of the piezoelectric element, as compared with the first discrete electrode,
 wherein the common electrode includes:
  a first common electrode, which faces the first discrete electrode in the thickness direction; and a second common electrode, which is separated from the first common electrode in the surface direction and faces the second discrete electrode in the thickness direction, wherein it is formed to satisfy at least one of a condition where the first common electrode faces a plurality of first discrete electrodes, which includes the first discrete electrode, in the thickness direction and a condition where the second common electrode faces a plurality of second discrete electrodes, which includes the second discrete electrode, in the thickness direction, wherein a connection wiring is further provided to connect the first common electrode with the second common electrode, wherein a width of the connection wiring in the surface direction is narrower than a width of the first common electrode and the second common electrode, wherein the plurality of discrete contacts are disposed on one side in a first direction along the surface direction with respect to the plurality of discrete electrodes, wherein a common wiring connecting the common electrode with the common contact includes a portion on another side in the first direction with respect to the plurality of discrete electrodes, wherein a plurality of discrete wirings connecting the plurality of discrete electrodes with the plurality of discrete contacts includes contact portions contacting the plurality of discrete electrodes, at ends on the one side of the plurality of discrete electrodes, and wherein the connection wiring includes a contact portion contacting each of the first common electrode and the second common electrode at an end on the other side of each of the first common electrode and the second common electrode.

2. The piezoelectric actuator according to claim 1, wherein the plurality of first discrete electrodes are arranged in a second direction along the surface direction, and which form a first discrete electrode row, and wherein the plurality of second discrete electrodes are arranged in the second direction, and form a second discrete electrode row that is arranged beside the first discrete electrode row in a third direction perpendicular to the second direction and along the surface direction.

3. A piezoelectric actuator, comprising:

a piezoelectric element;

a plurality of discrete electrodes, which is disposed on one side of the piezoelectric element in a thickness direction of the piezoelectric element;

a common electrode, which is disposed on another side of the piezoelectric element in the thickness direction and faces the plurality of discrete electrodes in the thickness direction with the piezoelectric element interposed therebetween;

a plurality of discrete contacts, which are respectively connected to the plurality of discrete electrodes, and a common contact, which is connected to the common electrode, wherein the plurality of discrete electrodes include:
  a plurality of first discrete electrodes, which are arranged in a first direction along a surface direction of the piezoelectric element and form a first discrete electrode row; and
  a plurality of second discrete electrodes, which are arranged in the first direction, form a second discrete electrode row that is arranged beside the first discrete electrode row in a second direction perpendicular to the first direction and along the surface direction and which are disposed at positions away from each corresponding discrete contact among the plurality of discrete contacts in the second direction, as compared with the plurality of first discrete electrodes, wherein the common electrode includes:
  a first common electrode, which faces at least one of the plurality of first discrete electrodes in the thickness direction; and
  a second common electrode, which is separated from the first common electrode in the second direction and faces at least one of the plurality of second discrete electrodes in the thickness direction, wherein at least one of the first common electrode and the second common electrode is made to extend in the first direction, wherein a connection wiring is further provided to connect the first common electrode with the second common electrode, wherein a width of the connection wiring in the second direction is narrower than a width of the first common electrode and the second common electrode, wherein the plurality of discrete contacts are disposed on one side in a third direction along the surface direction with respect to the plurality of discrete electrodes, wherein a common wiring connecting the common electrode with the common contact includes a portion on another side in the third direction with respect to the plurality of discrete electrodes, wherein a plurality of discrete wirings connecting the plurality of discrete electrodes with the plurality of discrete contacts includes contact portions contacting the plurality of discrete electrodes, at ends on the one side of the plurality of discrete electrodes, and wherein the connection wiring includes a contact portion contacting each of the first common electrode and the second common electrode at an end on the other side of each of the first common electrode and the second common electrode.

4. The piezoelectric actuator according to claim 3, wherein the first common electrode faces the plurality of first discrete electrodes forming the first discrete electrode row in the thickness direction, and wherein the second common electrode faces the plurality of second discrete electrodes forming the second discrete electrode row in the thickness direction.

5. The piezoelectric actuator according to claim 3, wherein the plurality of discrete contacts are disposed on a side opposite to the second discrete electrode row in the second direction with respect to the first discrete electrode row, and wherein, among a plurality of discrete wirings respectively connecting the plurality of discrete electrodes with the plurality of discrete contacts, a plurality of discrete wirings, which are respectively connected to the plurality of second discrete electrodes, extend in the second direction between a plurality of first discrete electrodes adjacent in the first direction.

6. The piezoelectric actuator according to claim 3, wherein a plurality of connection wirings, which includes the connection wiring, extend in the second direction between the plurality of first discrete electrodes adjacent in the first direction.

7. The piezoelectric actuator according to claim 1, wherein a plurality of discrete wirings connecting the plurality of discrete electrodes with the plurality of discrete contacts and the connection wiring are formed in the same layer.

8. The piezoelectric actuator according to claim 7,
wherein the plurality of discrete wirings and the connection wiring are made of the same material.

9. The piezoelectric actuator according to claim 1,
wherein the connection wiring includes a plurality of contact portions contacting at least one of the first common electrode and the second common electrode.

10. The piezoelectric actuator according to claim 1,
wherein the connection wiring includes a contact portion contacting each of the first common electrode and the second common electrode, at an outer edge which extends in a straight line along the surface direction in each of the first common electrode and the second common electrode.

11. The piezoelectric actuator according to claim 1,
wherein at least one of the first common electrode and the second common electrode includes a slit in a portion between the plurality of discrete electrodes facing in the thickness direction.

12. The piezoelectric actuator according to claim 1,
wherein the plurality of discrete electrodes further include a third discrete electrode which is disposed at a position away from a corresponding discrete contact among the plurality of discrete contacts in the surface direction, as compared with the second discrete electrode,
wherein the common electrode further includes a third common electrode which faces the third discrete electrode in the thickness direction,
wherein the connection wiring includes: a first connection part disposed between the first common electrode and the second common electrode; and a second connection part disposed between the second common electrode and the third common electrode, and
wherein the second connection part has a cross-sectional area larger than that of the first connection part.

13. The piezoelectric actuator according to claim 1,
wherein an electric resistance of a material of the connection wiring is lower than that of a material of the common electrode.

14. The piezoelectric actuator according to claim 13,
wherein the connection wiring extends from one end to another end in the surface direction in at least one of the first common electrode and the second common electrode.

15. The piezoelectric actuator according to claim 14,
wherein the connection wiring includes:
a first transverse portion, which extends from one end to another end of the first common electrode;
a second transverse portion, which extends from one end to another end of the second common electrode; and
a connection part, which is disposed between the first common electrode and the second common electrode and connects each of the first transverse portion and the second transverse portion.

16. A liquid discharge head, comprising:
the piezoelectric actuator according to claim 1;
a substrate, in which the piezoelectric actuator is disposed and a plurality of pressure chambers are formed to face the plurality of discrete electrodes in the thickness direction; and
a nozzle plate, which is disposed on a side opposite to the piezoelectric actuator with respect to the substrate, and in which a plurality of nozzles are formed to communicate with the plurality of pressure chambers.

17. The liquid discharge head according to claim 16,
wherein an insulating layer is disposed between the piezoelectric actuator and the substrate to cover the plurality of pressure chambers and includes a channel to supply liquid to the plurality of pressure chambers, and
wherein the connection wiring is formed in an annular shape to enclose the channel.

18. A piezoelectric actuator comprising:
a piezoelectric element;
a plurality of discrete electrodes, which is disposed on one side of the piezoelectric element in a thickness direction of the piezoelectric element;
a common electrode, which is disposed on another side of the piezoelectric element in the thickness direction of the piezoelectric element, and faces the plurality of discrete electrodes in the thickness direction with the piezoelectric element interposed therebetween;
a plurality of discrete contacts, which are respectively connected to the plurality of discrete electrodes, and
a common contact, which is connected to the common electrode,
wherein the plurality of discrete electrodes include:
a first discrete electrode; and
a second discrete electrode, which is disposed at a position away from a corresponding discrete contact among the plurality of discrete contacts in a surface direction of the piezoelectric element, as compared with the first discrete electrode,
wherein the common electrode includes:
a first common electrode, which faces the first discrete electrode in the thickness direction; and
a second common electrode, which is separated from the first common electrode in the surface direction and faces the second discrete electrode in the thickness direction, wherein it is formed to satisfy at least one of a condition where the first common electrode faces a plurality of first discrete electrodes, which includes the first discrete electrode, in the thickness direction and a condition where the second common electrode faces a plurality of second discrete electrodes, which includes the second discrete electrode, in the thickness direction,
wherein a connection wiring is further provided to connect the first common electrode with the second common electrode,
wherein a width of the connection wiring in the surface direction is narrower than a width of the first common electrode and the second common electrode,
wherein the common contact is disposed on one side in a first direction along the surface direction with respect to the plurality of discrete electrodes, and
a common wiring connecting the common electrode with the common contact includes: a facing portion on another side in the first direction with respect to the plurality of discrete electrodes; and connection portions which extend in the first direction from both sides of the facing portion in a second direction which is perpendicular to the first direction and along the surface direction and are connected to the common contact.

19. The piezoelectric actuator according to claim 18, further comprising:
coupling wirings which couple the connection portions with each of the first common electrode and the second common electrode.

20. A piezoelectric actuator, comprising:
a piezoelectric element;
a plurality of discrete electrodes, which is disposed on one side of the piezoelectric element in a thickness direction of the piezoelectric element;

a common electrode, which is disposed on another side of the piezoelectric element in the thickness direction and faces the plurality of discrete electrodes in the thickness direction with the piezoelectric element interposed therebetween;

a plurality of discrete contacts, which are respectively connected to the plurality of discrete electrodes, and a common contact, which is connected to the common electrode, wherein the plurality of discrete electrodes include:
- a plurality of first discrete electrodes, which are arranged in a first direction along a surface direction of the piezoelectric element and form a first discrete electrode row; and
- a plurality of second discrete electrodes, which are arranged in the first direction, form a second discrete electrode row that is arranged beside the first discrete electrode row in a second direction perpendicular to the first direction and along the surface direction and which are disposed at positions away from each corresponding discrete contact among the plurality of discrete contacts in the second direction, as compared with the plurality of first discrete electrodes, wherein the common electrode includes:
- a first common electrode, which faces at least one of the plurality of first discrete electrodes in the thickness direction; and
- a second common electrode, which is separated from the first common electrode in the second direction and faces at least one of the plurality of second discrete electrodes in the thickness direction, wherein at least one of the first common electrode and the second common electrode is made to extend in the first direction, wherein a connection wiring is further provided to connect the first common electrode with the second common electrode, wherein a width of the connection wiring in the second direction is narrower than a width of the first common electrode and the second common electrode, wherein the common contact is disposed on one side in a third direction along the surface direction with respect to the plurality of discrete electrodes, and a common wiring connecting the common electrode with the common contact includes: a facing portion on another side in the third direction with respect to the plurality of discrete electrodes; and connection portions which extend in the third direction from both sides of the facing portion in a fourth direction which is perpendicular to the third direction and along the surface direction and are connected to the common contact.

21. The piezoelectric actuator according to claim 20, further comprising:
coupling wirings which couple the connection portions with each of the first common electrode and the second common electrode.

* * * * *